(12) United States Patent
Ito et al.

(10) Patent No.: US 6,753,263 B1
(45) Date of Patent: Jun. 22, 2004

(54) ETCHING METHOD

(75) Inventors: Youbun Ito, Chofu (JP); Masahiro Yamada, Kawasaki (JP); Kouichiro Inazawa, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/700,785
(22) PCT Filed: May 18, 1999
(86) PCT No.: PCT/JP99/02578
§ 371 (c)(1),
(2), (4) Date: Feb. 5, 2001
(87) PCT Pub. No.: WO99/62111
PCT Pub. Date: Dec. 2, 1999

(30) Foreign Application Priority Data

May 22, 1998 (JP) ............................ 10-158436

(51) Int. Cl.$^7$ ............................................. H01L 21/302
(52) U.S. Cl. ....................... 438/714; 438/723; 438/724; 438/725; 438/734; 438/740
(58) Field of Search ................................. 438/714, 723, 438/724, 725, 734, 740

(56) References Cited

U.S. PATENT DOCUMENTS

| | | | | |
|---|---|---|---|---|
| 5,429,710 A | * | 7/1995 | Akiba et al. ................... | 216/17 |
| 5,728,595 A | * | 3/1998 | Fukase ......................... | 437/44 |
| 6,133,153 A | * | 10/2000 | Marquez et al. ............. | 438/706 |
| 6,184,150 B1 | * | 2/2001 | Yang et al. .................. | 438/740 |
| 6,211,092 B1 | * | 4/2001 | Tang et al. .................. | 438/719 |
| 6,227,211 B1 | * | 5/2001 | Yang et al. ................... | 134/1.1 |

FOREIGN PATENT DOCUMENTS

| | | |
|---|---|---|
| JP | 6-252107 | 9/1994 |
| JP | 6-267907 | 9/1994 |
| JP | 6-318575 | 11/1994 |
| JP | 8-236473 | 9/1996 |
| JP | 8-330277 | 12/1996 |
| JP | 9-036087 | 2/1997 |

OTHER PUBLICATIONS

"Highly Selective SiO$_2$ Etch Employing Inductively Coupled Hydro–Fluorocarbon Plasma Chemistry For Self Aligned Contact Etch"; Iijima et. al.; Japanese Journal of Applied Physics; Part I; vol. 36; 9A; pp 5498–5501; (Sep. 1997* ).*

* cited by examiner

Primary Examiner—G Goudreau
(74) Attorney, Agent, or Firm—Finnegan Henderson Farabow Garrett & Dunner, L.L.P.

(57) ABSTRACT

A lower electrode 106 with the temperature at its mounting surface set at 40° C. is provided inside a processing chamber 104 of an etching apparatus 100. After a wafer W is placed on the lower electrode 106, a processing gas with its gas composition and gas flow rate expressed as C$_4$F$_8$: CH$_2$F$_2$: Ar=7:4:500 (sccm) is induced into the processing chamber 104 while sustaining the pressure of the atmosphere inside the processing chamber 104 at 50 (mTorr). High-frequency power at 1500 (W) with the frequency at 13.56 (MHz) is applied to the lower electrode 106 to generate plasma. With the plasma thus generated, a carbon film is formed at shoulder 207 of an SiN$_x$ film layer 206 exposed inside a contact hole 210 and, at the same time, accumulation of carbon at the bottom of the contact hole 210 is prevented, to form a contact hole 210 achieving a high aspect ratio while preventing damage to the SiN$_x$ film layer.

8 Claims, 9 Drawing Sheets

Center

Edge

Implementation Example 6

Implementation Example 1

Implementation Example 2

Implementation Example 3

Implementation Example 4

Implementation Example 5

Implementation Example 6

Implementation Example 7

Implementation Example 8

Implementation Example 9

Implementation Example 10

Implementation Example 11

ETCHING METHOD

TECHNICAL FIELD

The present invention relates to an etching method that may be adopted in a process for manufacturing a semiconductor device.

BACKGROUND ART

To keep pace with the great improvements made with respect to the degree of integration of semiconductor devices in recent years, miniaturization of various elements formed on semiconductor substrates has become one of the crucial technical requirements. In order to meet this requirement, the distances between the individual gates (electrodes) formed on a semiconductor substrate must be reduced, and if contact holes are formed between the gates, the contact holes, too, must be miniaturized. However, as the distances between the gates become increasing small, the difficulty in forming ever smaller contact holes at accurate positions increases, due to the limits of the alignment performance of the stepper and the like. Accordingly, a self-aligning contact technology, whereby self-aligned contact holes are formed within the minute space between individual gates by forming a protective film (base) constituted of, for instance, an $SiN_x$ film at the surfaces of the gates and thereby preventing the gates from becoming etched during the contact hole formation, has been proposed of late. It is to be noted that $SiN_x$ as referred to in this specification may indicate a state in which SiN and $Si_3N_4$ are mixed as well as SiN or $Si_3N_4$ itself.

A mixed gas containing, for instance, $C_4F_8$ and CO is often used as the processing gas when forming contact holes at an a $SiO_2$ film (insulating film) covering the gates formed on a semiconductor substrate by employing the self-aligning contact technology described above, so that the selection ratio of the $SiO_2$ film layer relative to the $SiN_x$ film layer is improved. Namely, by using such a processing gas in which $C_4F_8$ constituting the processing gas contains a relatively large number of carbon atoms compared to $CF_4$ or $C_2F_6$ used in the prior art, a carbon film to constitute a protective film can be formed with ease at the inner wall surface of the contact holes. In addition, since CO is added in the processing gas, the formation of the carbon film is further facilitated. As a result, fluorine radicals constituting the etching ions do not readily come in contact with the $SiN_x$ film layer covered by the carbon film, thereby achieving an improvement in the selection ratio of the $SiO_2$ film layer relative to the $SiN_x$ film layer.

However, while the selection ratio of the $SiO_2$ film layer relative to the $SiN_x$ film layer is improved due to the presence of the carbon film formed at the inner wall surface of the contact holes by forming the contact holes using a mixed gas containing $C_4F_8$ and CO as described above, carbon becomes accumulated also at the bottoms of the contact holes. This results in the carbon accumulated at the bottoms of the contact holes preventing the fluorine radicals from reaching the bottoms with ease. Consequently, it becomes difficult to mill contact holes having a depth larger than a specific measurement, to lead to a reduction in the penetration and an etching stop.

In addition, while it has become one of the technological requirements in recent years to form contact holes achieving a high aspect ratio in extremely small spaces between gates, the structure of such deep contact holes makes it difficult for fluorine radicals to reach the bottoms of the contact holes. As a result, if the contact holes are formed by using the mixed gas containing $C_4F_8$ and CO as described above, the accumulation of carbon at the bottoms of the contact holes and the reduction in the quantity of fluorine radicals entering the contact holes further reduce the penetration and increases the occurrence of etching stop.

Furthermore, if contact holes are formed through a process in which carbon is accumulated readily at the bottoms of the contact holes as in the etching method in the prior art described above, it is necessary to perform over-etching on the semiconductor substrate in consideration of carbon which accumulates at the bottoms of the contact holes. However, if such an over-etching process is performed on the semiconductor substrate, the insulating film layer and the $SiN_x$ film layer, which are respectively provided to cover and protect the gates are also etched, to result in the insulating film layer and the gates themselves becoming exposed inside the contact holes.

Consequently, problems such as defective insulation and shorting of the gates, other wiring or electrodes may occur to lower the yield. In particular, the shoulder (corners) of the $SiN_x$ film layer, which often distend into the contact holes, tend to become etched very readily, and thus, if over-etching process is performed on the semiconductor substrate as described above, the worst damage is likely to occur at the comers. For this reason, the etching process can only be performed to an extent to which the shoulder of the $SiN_x$ film layer do not become damaged in the etching method in the prior art, which makes it extremely difficult to form contact holes achieving a high aspect ratio.

A first object of the present invention, which has been completed by addressing the problems of the prior art discussed above, is to provide a new and improved etching method which achieves an improvement in the selection ratio of the $SiO_2$ film layer relative to the $SiN_x$ film layer by forming a carbon film (protective film) at the shoulder of the $SiN_x$ film layer exposed inside the contact holes and makes it possible to form contact holes achieving a high aspect ratio by minimizing the accumulation of carbon at the contact hole bottoms.

A second object of the present invention is to provide a new and improved etching method that eliminates excessive etching which may cause damage to the shoulder of the $SiN_x$ film and achieves an improvement in yield by preventing defective insulation at the gates and the occurrence of dialectic breakdown.

DISCLOSURE OF THE INVENTION

In order to achieve the objects described above, in a first aspect of the present invention, an etching method for plasma-etching an $SiO_2$ film layer covering an $SiN_x$ film layer formed at a workpiece placed within an air-tight processing chamber by raising to plasma a processing gas induced into the processing chamber, which is characterized in that the processing gas is a mixed gas containing, at least, $C_4F_8$ and $CH_2F_2$, is provided.

In this etching method in which $CH_2F_2$ is used in the processing gas instead of CO, fluorine radicals can be generated from $CH_2F_2$ as well as from $C_4F_8$ to increase the quantity of fluorine radicals generated during the process. As a result, even when forming contact holes with a high aspect ratio, fluorine radicals can reach the bottoms of the contact holes with a high degree of reliability to make it possible to etch the bottoms while removing carbon accumulated at the bottoms of the contact holes, thereby facilitating the formation of contact holes with a specific depth.

In addition, since the bottoms of the contact holes can be etched with a high degree of reliability, it is not necessary to over-etch the workpiece and thus, damage to the $SiN_x$ film layer exposed inside the contact holes and, in particular, damage to the shoulder of the $SiN_x$ film layer can be prevented. As a result, since the insulating film layer covering the gates protected by $SiN_x$ film layer or the gates themselves are not exposed inside the contact holes, defective insulation at the gates and the occurrence of dialectic breakdown are prevented to achieve an improvement the yield. Furthermore, since the bottoms of the contact holes can be etched while sustaining a specific etching rate, the length of time required to perform the etching process can be reduced to achieve an improvement in throughput, as well.

Since $CH_2F_2$ constituting the processing gas contains carbon atoms, a carbon film to constitute a protective film can be formed at the inner wall surface of the contact holes with a high degree of reliability as in an etching method which utilizes a processing gas containing CO. Consequently, the inner wall surface of the contact holes are not etched readily, to prevent formation of contact holes with a bowed shape. Moreover, with the $SiN_x$ film layer exposed inside the contact holes and, in particular, the shoulder of the $SiN_x$ film layer, covered with the carbon film, the shoulder do not become etched and, therefore, damage to the shoulder is prevented. In addition, since fluorine radicals reach the bottoms of the contact holes with a high degree of reliability even though the processing is performed on the workpiece in a carbon-rich atmosphere in this manner, carbon does not accumulate at the bottoms of the contact holes.

In a second aspect of the present invention, an etching method for plasma-etching an $SiO_2$ film layer covering an $SiN_x$ film layer formed at a workpiece placed inside an air-tight processing chamber by raising to plasma a processing gas induced into the processing chamber, which includes a first step in which the $SiO_2$ film layer is etched by using a mixed gas containing at least $C_4F_8$ and CO as the processing gas and a second step in which the $SiO_2$ film layer is etched by using another mixed gas containing at least $C_4F_8$ and $CH_2F_2$ as the processing gas before or after the $SiN_x$ film layer becomes exposed, e.g., immediately before or immediately after the $SiN_x$ film layer becomes exposed, is provided.

In this etching method, in which the etching process is performed by using a mixed gas containing, at least, $C_4F_8$ and CO, the workpiece can be etched as fast as in the etching method in the prior art described earlier in a carbon-rich atmosphere. As a result, a carbon film is formed at the inner wall surface of the contact holes with ease and the etching process can be completed quickly without bowing the shape of the etched contact holes.

In addition, since the etching process is implemented by switching to another mixed gas containing at least $C_4F_8$ and $CH_2F_2$ before or after the $SiN_x$ film layer becomes exposed, the workpiece can be processed in a carbon-rich and radical-rich atmosphere. Thus, the carbon accumulated at the bottoms of the contact holes can be removed to achieve reliable etching at the bottoms, and with the occurrence of an etching stop prevented, an improvement in the penetration is achieved. Furthermore, since the use of such a processing gas makes it possible to prevent accumulation of carbon at the bottoms of the contact holes while depositing a carbon film at the shoulder of the $SiN_x$ film layer, contact holes achieving a specific shape can be formed.

By setting the flow rate ratio ($CH_2F_2/C_4F_8$) of $C_4F_8$ and $CH_2F_2$ in the mixed gas containing at least $C_4F_8$ and $CH_2F_2$ to a value which is essentially within a range of $0.4 \leq (CH_2F_2/C_4F_8) \leq 1.0$ by setting the partial pressure corresponding to $C_4F_8$ relative to the entire pressure of the mixed gas containing at least $C_4F_8$ and $CH_2F_2$ at a value which is essentially equal to or higher than 0.4 (mTorr) or equal to or lower than 0.8 (mTorr), the selection ratio of the $SiO_2$ film layer relative to the $SiN_x$ film layer can be further improved.

Moreover, by setting the density of the plasma excited inside the processing chamber at a value which is essentially equal to or higher than $1.5 \times 10^{10}$ (number of ions/cm$^3$) equal to or lower than $1.2 \times 10^{11}$ (number of ions/cm$^3$) or by placing the workpiece on the mounting surface of a suceptor provided inside the processing chamber and setting the temperature of the susceptor mounting surface at a value which is essentially equal to or higher than 20° C. or higher and equal to or lower than the heat resistance temperature of the photoresist layer constituting the mask pattern of the the $SiO_2$ film layer, the selection ratio of the $SiO_2$ film layer relative to the $SiN_x$ film layer can be further improved.

In addition, by adding an inert gas into the mixed gas containing at least $C_4F_8$ and $CH_2F_2$ or adding an inert gas into the mixed gas containing at least $C_4F_8$ and CO, the various processing conditions such as the etching rate can be easily adjusted.

THE BEST MODE FOR CARRYING OUT THE INVENTION

The following is a detailed explanation of an embodiment of the etching method according to the present invention, given in reference to the attached drawings.

(1) Structure of Etching Apparatus

Figure 1:
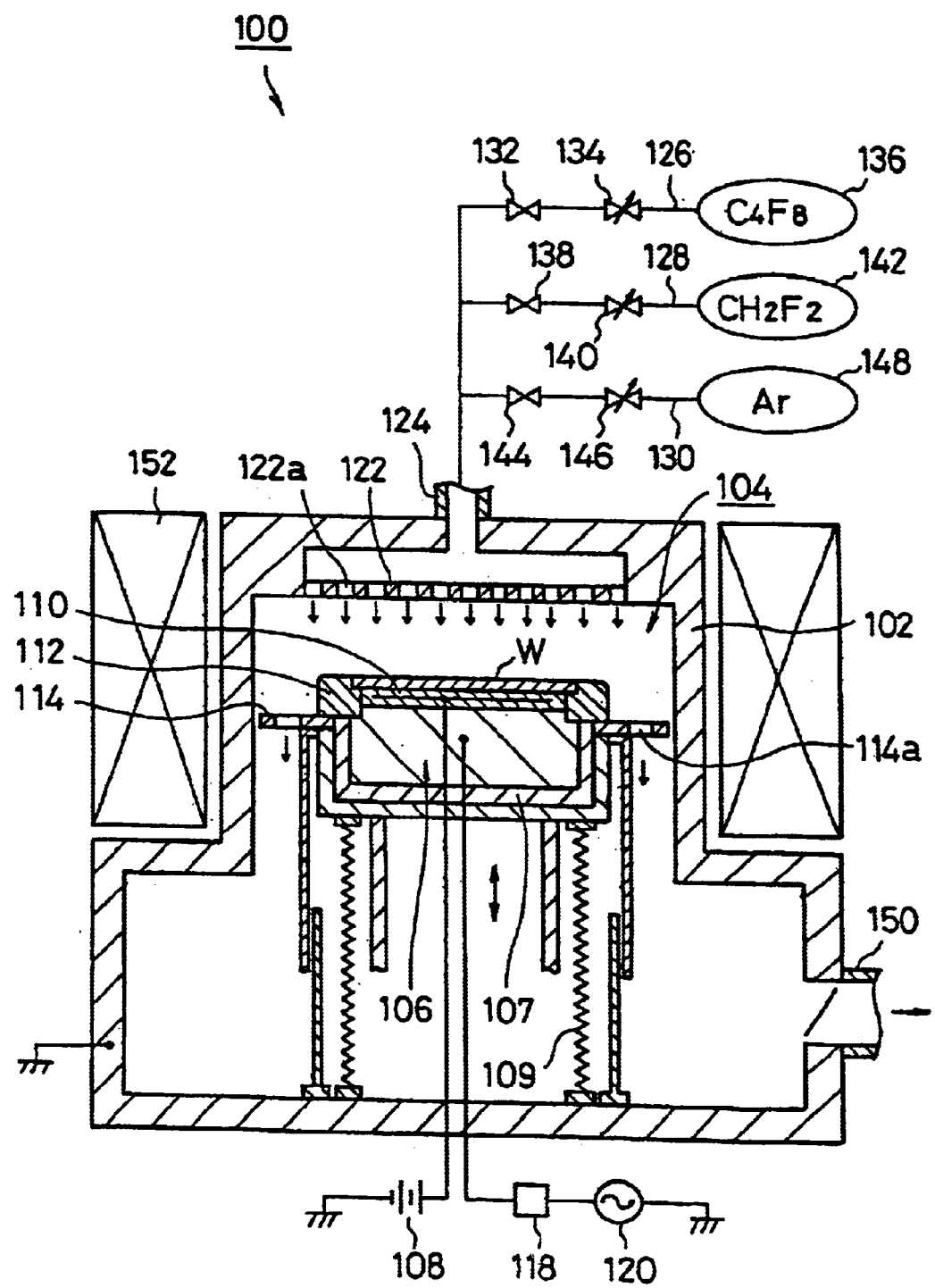
FIG. 1 is a schematic sectional view of an etching apparatus that may adopt the present invention.

First, in reference to FIG. 1, an etching apparatus 100 that may adopt the etching method in the embodiment is explained.

Inside a processing container 102 of the etching apparatus 100 in the figure, a processing chamber 104 is formed, and inside the processing chamber 104, a lower electrode 106 constituting a susceptor capable of moving up and down freely is provided. On top of the lower electrode 106, an electrostatic chuck 110 connected to a high-voltage DC source 108 is provided, and a workpiece such as a semiconductor wafer (hereafter referred to as a "wafer") W is placed on the upper surface of the electrostatic chuck 110. In addition, a focus ring 112 achieving an insulating property is provided around the wafer W placed on the lower electrode 106. In addition, a conductive baffle plate 114 having numerous through holes 114a is provided via an insulator 107 around the lower electrode 106. The baffle plate 114 is electrically continuous with the grounded processing container 102 via, for instance, a stainless bellows 109. A high-frequency source 120 that outputs plasma-generating high frequency power is connected to the lower electrode 106 via a matcher 118.

At the ceiling of the processing chamber 104 facing opposite the mounting surface of the lower electrode 106, an upper electrode 122 having numerous gas outlet holes 122a is provided, and in the example illustrated in the figure, the upper electrode 122 constitutes part of the processing container 102. A gas supply pipe 124 is connected to the gas outlet holes 122a, and in the example shown in the figure, first~third branch pipes 126, 128 and 130 are connected to the gas supply pipe 124. A gas supply source 136 that supplies $C_4F_8$ is connected to the first branch pipe 126 via an open/close valve 132 and a flow-regulating valve 134A gas supply source 142 that supplies $CH_2F_2$ in the embodiment is connected to the second branch pipe 128 via an open/close valve 138 and a flow-regulating valve 140. A gas supply source 148 that supplies Ar is connected to the third branch pipe 130 via an open/close valve 144 and a flow-regulating valve 146. It is to be noted that the structure adopted to supply these individual processing gases is to be detailed later. The inert gas added into the processing gas is not limited to Ar in the example above and any inert gas such as Kr may be used instead, as long as it can be utilized to adjust the plasma excited inside the processing chamber 104. In addition, various types of gases such as $O_2$, $N_2$, CO and $CO_2$ may be added in the processing gas.

Furthermore, near the bottom of the processing container 102, a discharge pipe 150 which communicates with a vacuum drawing mechanism (not shown) is connected, and through the function of the vacuum drawing mechanism, the atmosphere inside the processing chamber 104 is sustained at a specific reduced pressure. Also, outside the processing chamber 104, a magnet 152 is provided so as to enclose the outer sidewalls of the processing container 102, and the magnet 152 forms the rotating magnetic field in the plasma area located between the upper electrode 122 and the lower electrode 106.

(2) Structure of Wafer

Figure 2:
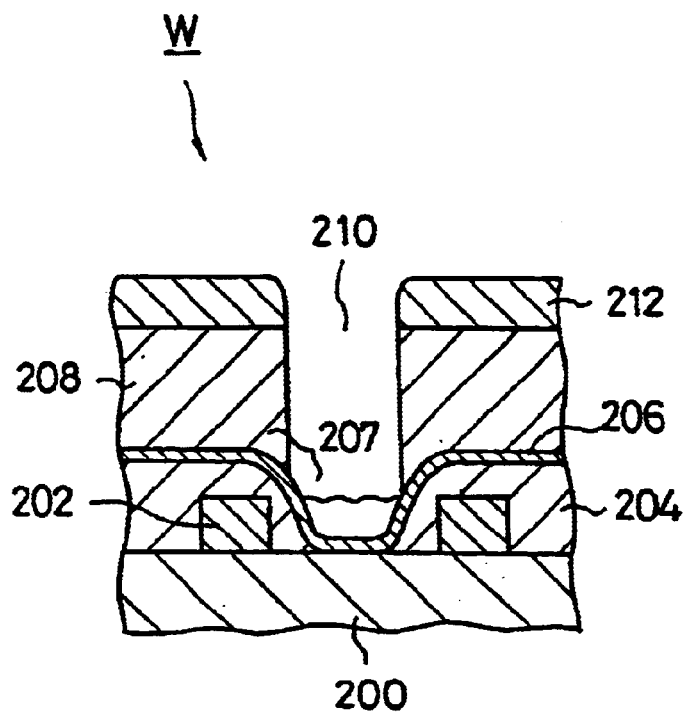
FIG. 2 is a schematic sectional view illustrating a semiconductor wafer to be processed on the etching apparatus shown in FIG. 1.

Next, in reference to FIG. 2, the structure of the wafer W to undergo the etching process in the etching apparatus described above is explained.

Gates 202 are formed on an Si (silicon) substrate 200 constituting the wafer W, with an insulating film layer 204 formed to cover the gates 202. In addition, an $SiN_x$ film layer 206 is formed so as to cover the surface of the insulating film layer 204. The $SiN_x$ film layer 206 prevents the gates 202 from becoming etched during the formation of contact holes 210 which is to be detailed later and enables formation of a self-aligned contact hole 210 between the gates 202. In addition, a silicon oxide film constituting an insulating film layer, e.g., an $SiO_2$ film layer 208 is formed over the $SiN_x$ film layer 206. It is to be noted that the insulating film layer 204 and the $SiO_2$ film 208 may be constituted of BPSG (silicate glass constituted of boron and phosphorus), PSG (silicate glass constituted of phosphorus), TEOS (tetra-ethoxy ortho-silane), Th-OX (thermal oxide) or SOG (spion glass). In addition, a photoresist layer 212 to constitute a mask pattern for the contact hole 210 is formed over the $SiO_2$ film layer 208.

(3) Contact Hole Formation Process

Next, in reference to FIGS. 1 and 2, the process through which the contact hole 210 is formed between the gates 202 at the wafer W described above is explained.

First, the temperature of the mounting surface of the lower electrode 106 is adjusted to a level which is essentially equal to or higher than 20° C. and equal to or lower than the heat resistance temperature of the photoresist layer 212, i.e., the temperature at which the photoresist layer 212 melts and, more desirably, within a range of 20° C.~60° C., e.g., at 40° C., and then the wafer W is placed on the mounting surface.

Next, the processing gas in the embodiment, i.e., the mixed gas containing $C_4F_8$, $CH_2F_2$ and Ar is induced into the processing chamber 104. During this process, the flow rates of $C_4F_8$, $CH_2F_2$ and Ar are respectively adjusted at the corresponding for regulating valves 134, 140 and 146. The flow rate of $C_4F_8$ is set at a level which is essentially within the range of 5 (sccm)~15 (sccm) and more preferably within the range of 6 (sccm)~8 (sccm) in the embodiment. The flow rate of $CH_2F_3$ is set at a level which is essentially within the range of 2 (sccm)~10 (sccm) and more preferably within the range of 3 (sccm)~5 (sccm). In addition, the flow rate of Ar is set at a level which is essentially within the range of 400 (sccm)~600 (sccm) and more preferably at 500 (sccm). At the same time, the flow rates of the individual processing gases should be adjusted as appropriate so as to set the flow rate ratio ($CH_2F_2/C_4F_8$) of $C_4F_8$ and $CH_2F_2$ essentially in a range of 0.4~1.0, and more preferably, within the range of 0.53~0.8 and even more desirably within the range of 0.55~0.7.

Concurrently while the processing gas is being induced into the processing chamber 104, the vacuum drawing is implemented inside the processing chamber 104. At this time, the pressure atmosphere in the processing chamber 104 should be set essentially within the range of 30 (mTorr) ~70 (mTorr), and more desirably within the range of 35 (mTorr)~55 (mTorr). At the same time, the pressure atmosphere in the processing chamber 104 should be adjusted as appropriate so as to set the partial pressure corresponding to $C_4F_8$ relative to the entire pressure of the mixed gas containing $C_4F_8$, $CH_2F_2$ and Ar is within a range of 0.4 (mTorr)~0.8 (mTorr).

Then, a rotating magnetic field is formed in the plasma area inside the processing chamber 104 by rotating the magnet 152. Then, a specific level of high-frequency power is applied to the lower electrode 106 to excite plasma inside the processing chamber 104. During this process, the high-frequency power should be adjusted so as to set the density of plasma excited inside the processing chamber 104 essentially within the range of $1.5–10^{10}$ (number of ions/cubic cm)~$1.2\times10^{11}$ (number of ions/cm$^3$). In other words, in the embodiment, high-frequency power achieving a frequency of 13.56 (MHz) and a power level of 1400 (W)~2000 (W) and, more preferably,. a power level of 1500 (W), for instance, is applied to the lower electrode 106. As a result, a glow discharge occurs between the upper electrode 122 and the lower electrode 106 to dissociate the processing gas in the embodiment having been induced into the processing chamber 104, thereby generating high-density plasma. Then, a specific type of etching process is performed on the wafer W with the plasma thus generated.

During this process, since the mixed gas comprising $C_4F_8$, $CH_2F_2$ and Ar is utilized as the processing gas in the embodiment, a carbon-rich atmosphere can be created from $C_4F_8$ and $CH_2F_2$ without having to add CO in the processing gas as necessary in the etching method in the prior art explained earlier. As a result, a carbon film can be formed with ease at the exposed surfaces of the $SiN_x$ film layer 206, the $SiO_2$ film layer 208 and the photoresist layer 212 constituting the inner side wall surface of the contact hole 210. Thus, since the inner side wall surface of the contact hole 210 does not become etched readily, the contact hole is not formed in a bowed shape.

In addition since the carbon layer covers the surface of the $SiN_x$ film layer 206, and in particular, a shoulder 207 of the $SiN_x$ film layer 206, fluorine radicals generated from $C_4F_8$ and $CH_2F_2$ are prevented from readily reaching the shoulder 207 which would be readily etched to prevent damage to the shoulder 207 of the $SiN_x$ film layer 206. As a result, the selection ratio of the $SiN_x$ film layer 206 and the $SiO_2$ film layer 208 improves and the insulating film layer 204 and the gates 202 protected by the $SiN_x$ film layer 206 do not become damaged, thereby preventing insulation defects at the gates and the occurrence of dialectic breakdown and achieving an improvement in yield.

By using $CH_2F_2$ in the processing gas as in the embodiment instead of CO, fluorine radicals to constitute the etchant seed are also generated from $CH_2F_2$ as well as from $C_4F_8$, to increase the quantity of fluorine radicals contained in the plasma. Consequently, fluorine radicals can reach in a reliable manner the bottom of the contact holes 210 with a high aspect ratio formed in the extremely small space between the gates 202, to make it possible to remove carbon accumulated at the bottom with ease and to etch the bottom at a constant etching rate without reducing the penetration or causing an etching stop. Furthermore, since Ar is added into the processing gas, the density and the like of the plasma generated inside the processing chamber 104 can be adjusted as necessary.

In the embodiment which assumes the structure described above and utilizes the mixed gas constituted of $C_4F_8$, $CH_2F_2$ and Ar as the processing gas, a carbon-rich atmosphere is created as in an etching method which utilizes a processing gas containing CO, and a large quantity of fluorine radicals can be generated unlike in the etching method which utilizes a processing gas containing CO. As a result, the carbon film is formed at the inner side wall surface of the contact hole 210 alone and the accumulation of carbon at the bottom of the contact hole 210 is prevented, so that an insulation defect at the gates 202 and the occurrence of dialectic breakdown are prevented and the penetration of the contact hole 210 is improved even when the contact hole 210 formed in the extremely small space between the gates 202 has a high aspect ratio.

EXAMPLES OF IMPLEMENTATION

Next, specific examples in which the etching method according to the present invention is implemented are explained. It is to be noted that since contact holes 210 are formed between gates 202 formed at the wafer W by using the mixed gas containing $C_4F_8$, $CH_2F_2$ and Ar in the etching apparatus 100 in the embodiment explained above and by varying specific conditions such as the flow rates of the processing gases, the pressure of the atmosphere in the processing chamber 104, the level of the high-frequency power applied to the lower electrode 106 and the temperature of the mounting surface of the lower electrode 106, the same reference numbers are assigned to components achieving roughly identical functions and structural features to those in the etching apparatus 100 and the wafer W explained earlier to preclude the necessity for repeated explanation thereof.

(A) Change in $CH_2F_2$ Flow Rate

First, individual examples of implementation achieved by varying the flow rate of $CH_2F_2$ are listed in the following table. It is to be noted that the etching process was performed in the individual implementation examples with the pressure of the atmosphere inside the processing chamber 104 set at 50 (mTorr), the temperature at the upper electrode 122 and the inner wall surfaces of the processing chamber 104 set at 60° C. and the temperature of the lower electrode 110 set at 40° C. In addition, high-frequency power achieving a frequency of 13.56 (MHz) and a power level of 1600 (W) was applied to the lower electrode 106. Wafers W having a 200 mm diameter were used. The process was implemented in an etching apparatus 100 having a processing chamber 102 with a 38 (1) capacity.

In addition, the uniformity within the work surface of the wafer W (hereafter referred to as the "surface uniformity") and the selection ratio of the $SiO_2$ film layer 208 relative to the $SiN_x$ film layer 206 were ascertained for each implementation example, with the resulting cross sectional shape (etching shape) achieved in the wafer W illustrated in the corresponding figure. It is to be noted that the surface uniformity indicates by what percentages the etching rates at the center and at an edge deviate from the average etching rate calculated by averaging the etching rates at the center and the edge of the wafer W (referred to as the "average etching rate" in the table), and the larger numerical value (absolute value) the degree of surface uniformity is not good and the smaller numerical value (absolute value) the degree of surface uniformity is good. In addition, the selection ratio of the $SiO_2$ film layer 208 relative to the $SiN_x$ film layer 206 (referred to as the "$SiO_2/SiN_x$ selection ratio" in the table) is represented by the average of values indicating ($SiO_2$ film layer etching rate)/($SiN_x$ film layer etching rate) ratios at the center and an edge of the wafer W in a state in which the $SiN_x$ film layer 206 is exposed with the etching process performed on the SiO₂ film layer 208 at an advanced stage, as illustrated in FIG. 2.

TABLE 1

Figure 3:
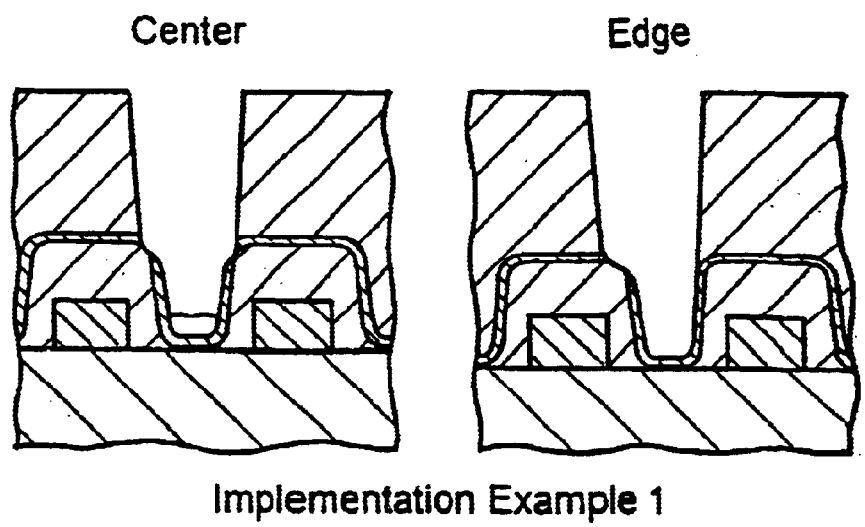
FIG. 3 is a schematic sectional view of a semiconductor wafer having undergone an etching process in an example of implementation of the present invention.
Figure 4:
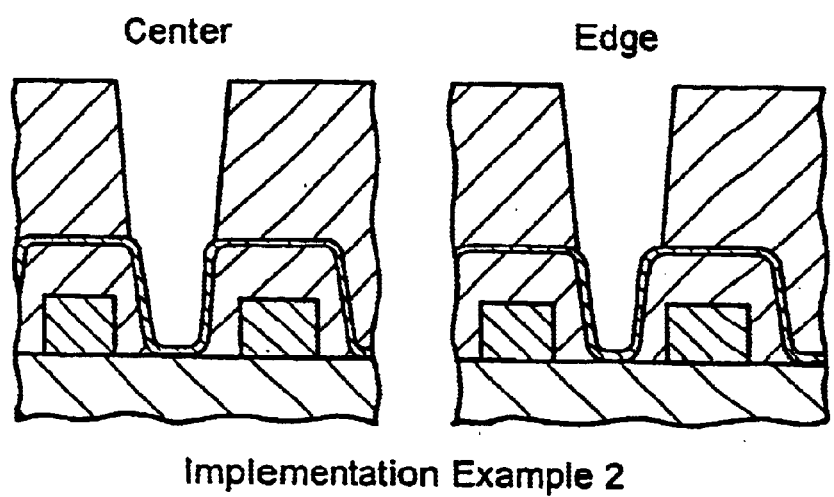
FIG. 4 is a schematic sectional view of a semiconductor wafer having undergone an etching process in an example of implementation of the present invention.
Figure 5:
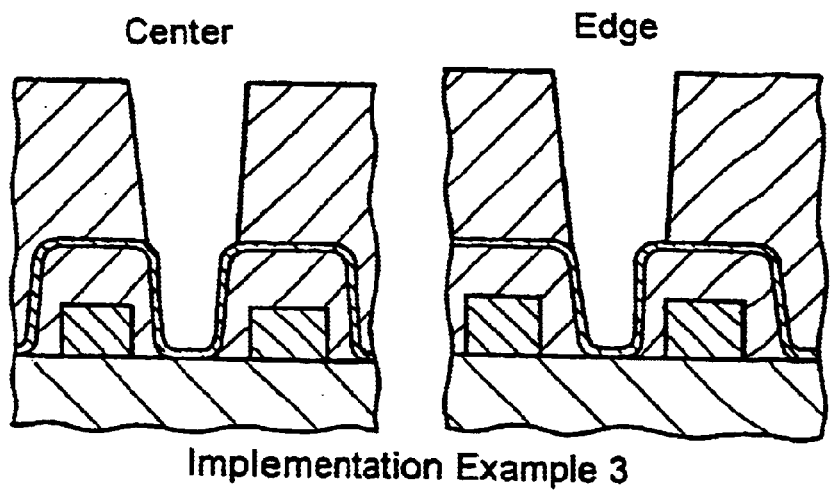
FIG. 5 is a schematic sectional view of a semiconductor wafer having undergone an etching process in an example of implementation of the present invention.
Figure 6:
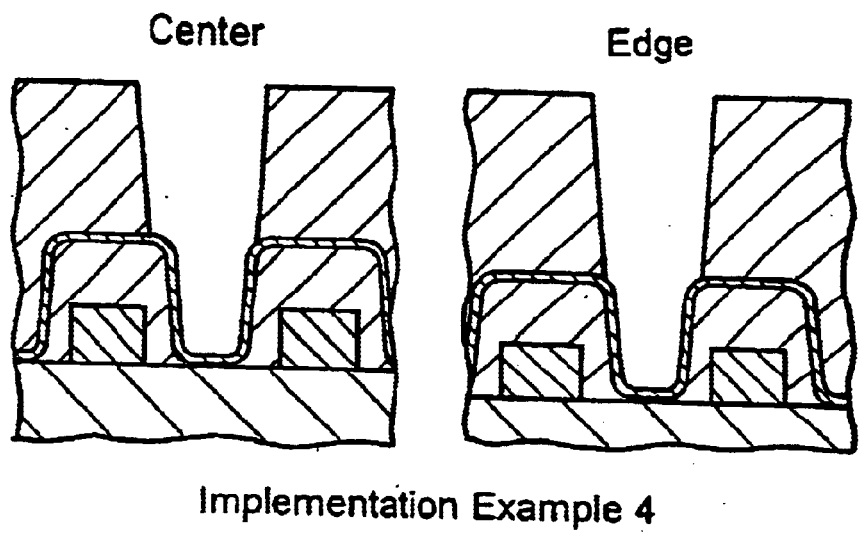
FIG. 6 is a schematic sectional view of a semiconductor wafer having undergone an etching process in an example of implementation of the present invention.
Figure 7:
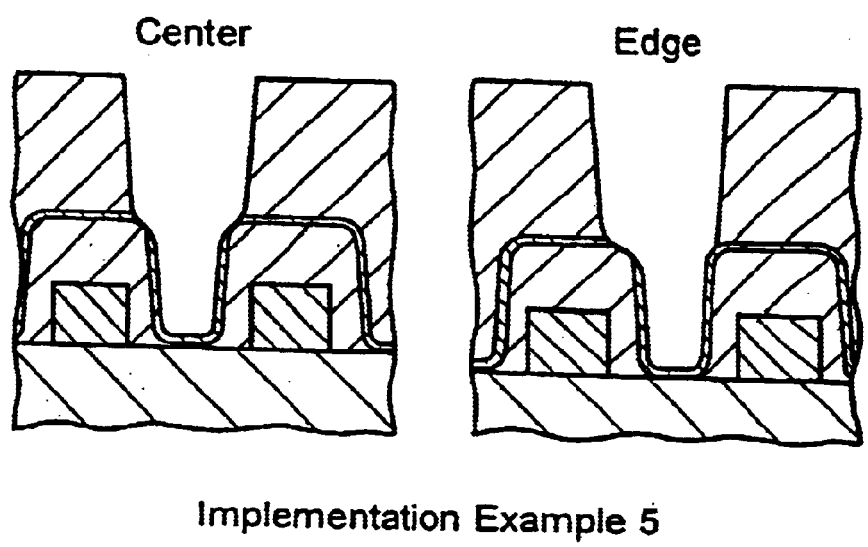
FIG. 7 is a schematic sectional view of a semiconductor wafer having undergone an etching process in an example of implementation of the present invention.

| Implementation example | Processing gas flow rates (sccm) | | | Wafer surface uniformity (± %) | SiO₂ film layer average etching rate (lambda/min) | SiO₂/ SiN$_x$ selection ratio | Contact hole cross sectional shape |
|---|---|---|---|---|---|---|---|
| | C₄F₈ | CH₂F₂ | Ar | | | | |
| 1 | 7 | 0 | 500 | 1.2 | 4250 | 15.6 | FIG. 3 |
| 2 | 7 | 3 | 500 | 1.2 | 4050 | 18.6 | FIG. 4 |
| 3 | 7 | 4 | 500 | 1.2 | 4050 | 34.4 | FIG. 5 |
| 4 | 7 | 5 | 500 | 5.0 | 4000 | 24.8 | FIG. 6 |
| 5 | 7 | 7 | 500 | 5.1 | 3900 | 25.5 | FIG. 7 |

As indicated in the table above, by adjusting the flow rate of CH₂F₂ to a value of approximately 4 (sccm), it can be assured that contact holes 210 achieving a specific shape can be formed without etching the shoulder 207 of the SiN$_x$ film layer 206 exposed in the contact holes 210.

In addition, with the flow rate of CH₂F₂ set at 4 (sccm), contact holes 210 achieving a specific shape were formed both at the center and at the edge of the wafer W as illustrated in FIG. 5. Namely, the shoulder 207 of the SiN$_x$ film layer 206 were not etched and no carbon accumulated at the bottoms of the contact holes 210 either at the center or at the edge of the wafer W. By setting the flow rate of CH₂F₂ at 3 (sccm) or 5 (sccm), too, contact holes each achieving a specific shape were formed as shown in FIGS. 4 and 6, as at the flow rate of 4 (sccm). However, when the flow rate of CH₂F₂ was set at 0 (sccm) or 7 (sccm), the shoulder 207 of the SiN$_x$ film layer 206 became etched, as shown in FIGS. 3 and 7 and, at the same time, carbon accumulated at the bottoms of the contact holes 210.

The results discussed above indicate that by setting the flow rate of CH₂F₂ added in the mixed gas also containing CH₄F₈ and Ar within the range of 3 (sccm)~5 (sccm) when performing an etching process on the wafer W on the etching apparatus 100 under the various conditions outlined earlier, contact holes 210 achieving a specific shape can be formed over the entire surface of the wafer W. However, since the results given above were achieved by performing an etching process on the etching apparatus 100 as described above, it may not be possible to formed contact holes 210 achieving the specific shape at the same gas flow rate on another processing apparatus due to the difference in the capacity of the processing chamber and the like. Accordingly, by adjusting the flow rates of the individual processing gases in conformance to the flow rate ratio (CH₂F₂/C₄F₈) of C₄F₈ and CH₂F₂ constituting the processing gas, contact holes 210 achieving a specific shape can be formed at all times without being affected by structural differences among etching apparatuses.

Figure 8:
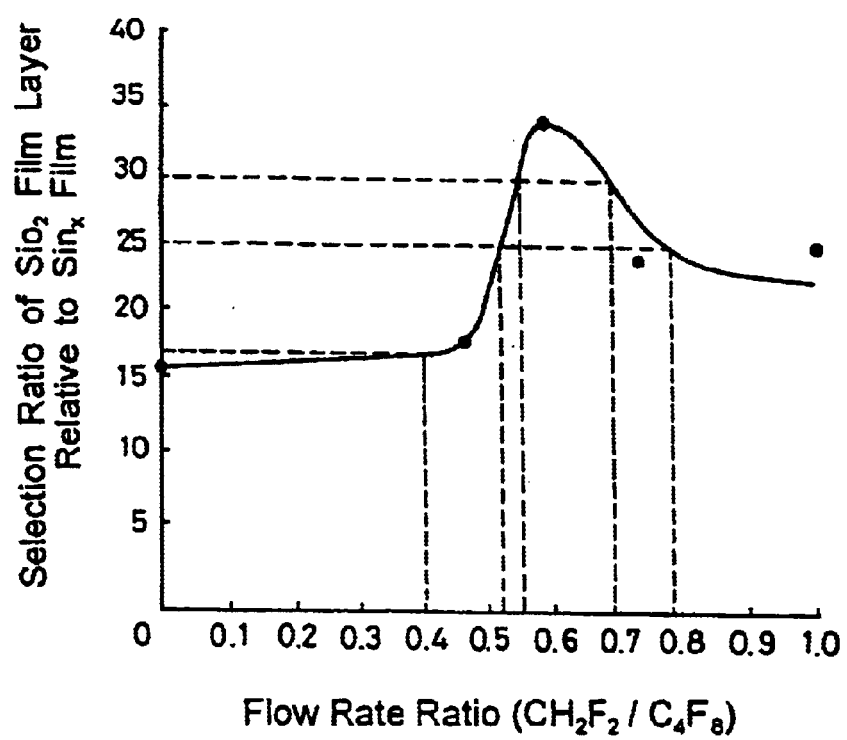
FIG. 8 schematically illustrates the relationship between the flow rate ratio of the processing gas and the selection ratio of the $SiO_2$ film at the semiconductor wafer.

Now, in reference to FIG. 8, the relationship between the flow rate ratio (CH₂F₂/C₄F₈) of C₄F₈ and CH₂F₂ and the selection ratio of the SiO, film layer 208 relative to the SiN$_x$ film layer 206 is explained. When the flow rate ratio (CH₂F₂/C₄F₈) is 0.4~1.0, the numerical value of the selection ratio is approximately 17 or larger and when the flow rate ratio is 0.53~0.8, the selection ratio is approximately 25 or higher. Furthermore, a selection ratio of approximately 30 or higher is achieved with the flow rate ratio in a range of 0.55~0.7. When the flow rate ratio is approximately 0.57, the selection ratio is the highest at approximately 34 for the range, achieved by using the processing gas with the flow rate ratio of C₄F₈:CH₂F₂:Ar=7:4:500 (sccm) corresponding to FIG. 5.

The selection ratio of the SiO₂ film layer 208 relative to the SiN$_x$ film layer 206 only needs to be approximately 20 under normal circumstances, and by adjusting the flow rates of the processing gas constituents so as to set the flow rate ratio (CH₂F₂/C₄F₈) essentially within the range of 0.4~1.0, more desirably essentially within the range of 0.53~0.8 and even more desirably the essentially within the range of 0.55~0.7 as described earlier, a selection ratio of up to approximately 34 can be achieved. It is to be noted that in FIG. 8 the vertical axis represents the selection ratio of the SiO₂ film layer relative to the SiN$_x$ film layer 206 and the horizontal axis represents the flow rate ratio (CH₂F₂/C₄F₈).

(B) Changes in Pressure Atmosphere Inside Processing Chamber

Next, implementation examples achieved by varying the pressure of the atmosphere inside the processing chamber 104 are explained. In implementation example 6 and implementation example 7 in the table below, the process etching was performed with the individual conditions other than the pressure of the atmosphere inside the processing chamber 104 set as in implementation example 3 mentioned earlier. Namely, the flow rates of the processing gas constituents were set at C₄F₈:CH₂F₂:Ar=7:4:500 (sccm) as in implementation example 3. In addition, for implementation example 6 and implementation example 7, the surface uniformity of the wafer W and the selection ratio of the SiO₂, film layer 208 relative to the SiN$_x$ film layer 206 were ascertained with the resulting cross sectional shape of the wafer W illustrated in the corresponding figure, as for implementation examples 1~5 explained earlier.

TABLE 2

Figure 9:
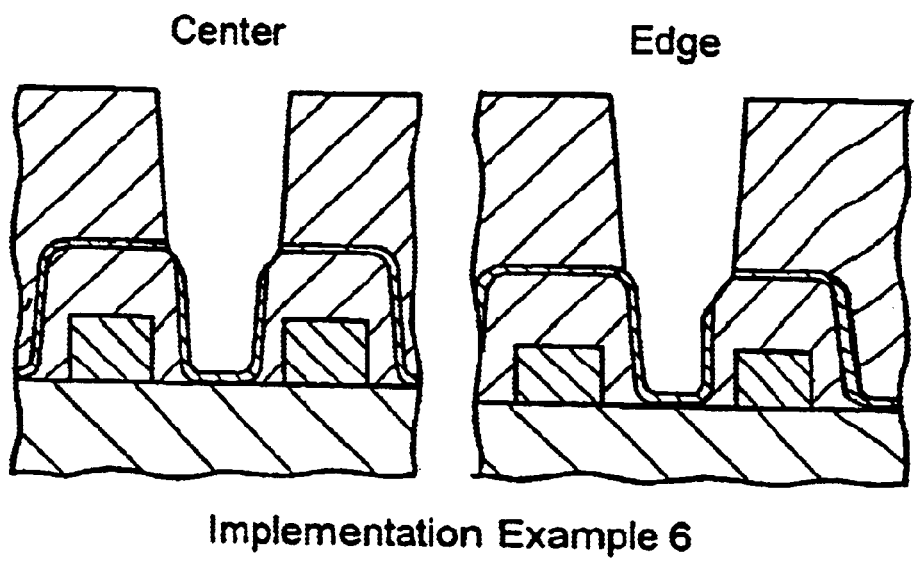
FIG. 9 is a schematic sectional view of a semiconductor wafer having undergone an etching process in an example of implementation of the present invention.
Figure 10:
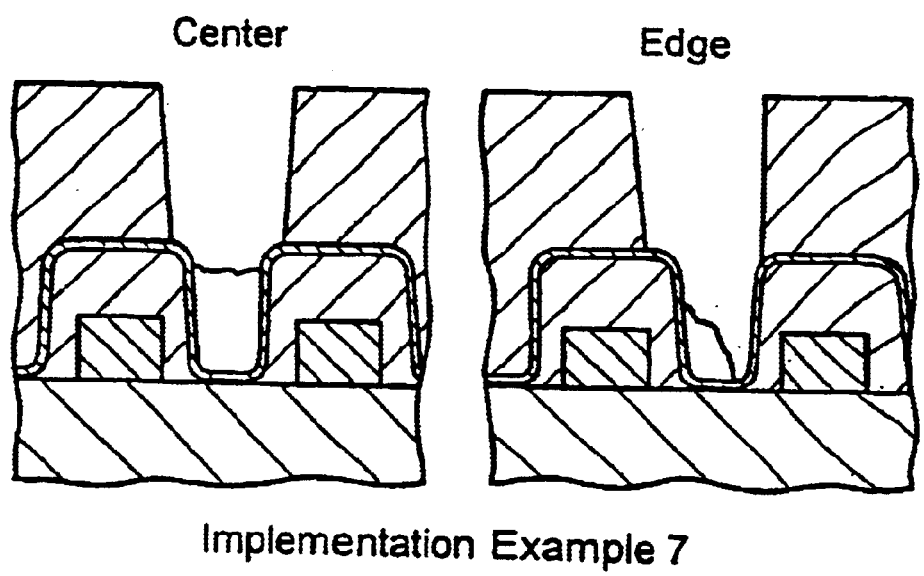
FIG. 10 is a schematic sectional view of a semiconductor wafer having undergone an etching process in an example of implementation of the present invention.

| Implementation example | Pressure atmosphere inside processing chamber (mTorr) | Wafer surface uniformity (±%) | SiO₂ film layer average etching rate (lambda/min) | SiO₂/ SiN$_x$ selection ratio | Contact hole cross sectional shape |
|---|---|---|---|---|---|
| 6 | 40 | 2.6 | 3800 | 13.2 | FIG. 9 |
| 3 | 50 | 1.2 | 4050 | 34.4 | FIG. 5 |
| 7 | 60 | 6.8 | 4400 | 70.6 | FIG. 10 |

While carbon does not accumulate readily at the bottoms of contact holes 210 to enable formation of contact holes 210 with a specific depth, as shown in FIG. 9, when the pressure of the atmosphere in the processing chamber 104 is set at 40 (mTorr) as in implementation example 6, the shoulder 207 of the SiN$_x$ film layer 206 becomes etched and damaged as shown in the figure. In addition, while the shoulders 207 of the SiN$_x$ film layer 206 can be protected by the carbon film in a reliable manner by setting the pressure of the atmosphere inside the processing chamber 104 at 60 (mTorr) as in implementation example 7, carbon accumulates at the bottoms of the contact holes 210 to cause an etching stop and reduce the penetration, as shown in FIG. 10.

If, on the other hand, the pressure of the atmosphere inside the processing chamber 104 is set at 50 (mtorr) as in implementation example 3 described earlier, carbon is not accumulated at the bottoms of the contact holes 210 and the shoulders 207 of the $SiN_x$ film layer 206 are not etched so that the contact holes 210 each achieving a specific shape and a specific depth are formed, as illustrated in FIG. 5.

The results discussed above indicate that by setting the pressure of the atmosphere inside the processing chamber 104 at approximately 50 (mTorr) when performing an etching process on the wafer W on the etching apparatus 100, contact holes 210 achieving a specific shape are formed at the wafer W. However, the level of the pressure of the atmosphere above is valid only in conjunction with the etching apparatus 100, and contact holes 210 may be formed differently if implementation example 3, 6 or 7 is adopted in another processing apparatus, due to a difference in the volumetric capacity of the processing chamber and the like. Accordingly, by setting the pressure atmosphere inside the processing chamber 104 in conformance to the partial pressure corresponding to $C_4F_8$ relative to the entire pressure of the processing gas containing $C_4F_8$, $CH_2F_2$ and Ar used in implementation example 3, which is calculated to be 0.68 (mTorr), contact holes 210 achieving a specific shape can be formed on any etching apparatus, as in implementation example 3. In addition, by setting the partial pressure as appropriate within the range of 0.4 (mTorr)~0.8 (mTorr), contact holes 210 achieving a specific shape can be formed as in implementation example 3.

(C) Changes in High-frequency Power Applied to Lower Electrode

Implementation examples in which the high-frequency power applied to the lower electrode 106 is varied are explained. In the implementation examples 8 and 9 in the table below, the individual conditions other than the level of the high-frequency power applied to the lower electrode 106 were set the same as those in implementation example 3. In addition, as in implementation examples 1~7 explained earlier, the surface uniformity at the wafer W and the selection ratio of the $SiO_2$ film layer 208 relative to the $SiN_x$ film layer 206 were ascertained with the resulting cross sectional shape of the wafer W illustrated for implementation examples 8 and 9. It is to be noted that the frequency of the high-frequency power was set at 13.56 MHz as in implementation example 3.

TABLE 3

Figure 11:
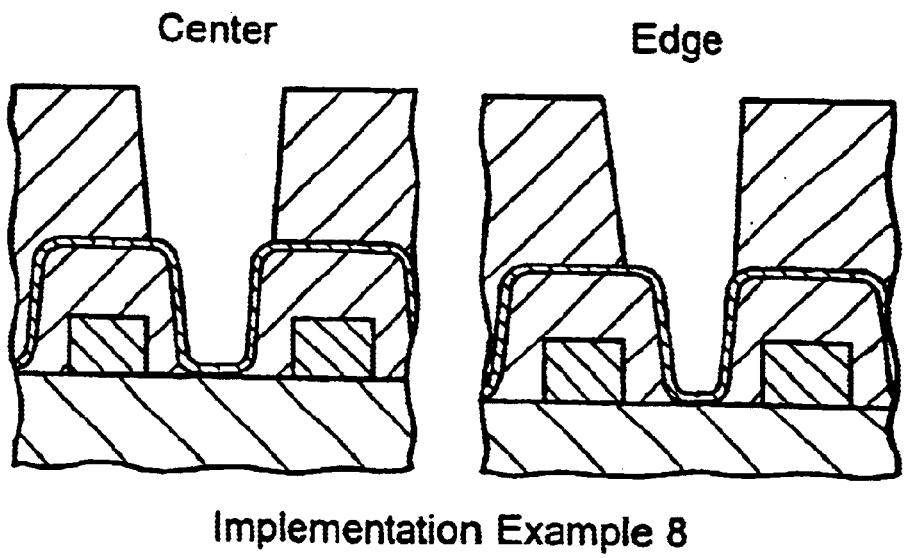
FIG. 11 is a schematic sectional view of a semiconductor wafer having undergone an etching process in an example of implementation of the present invention.
Figure 12:
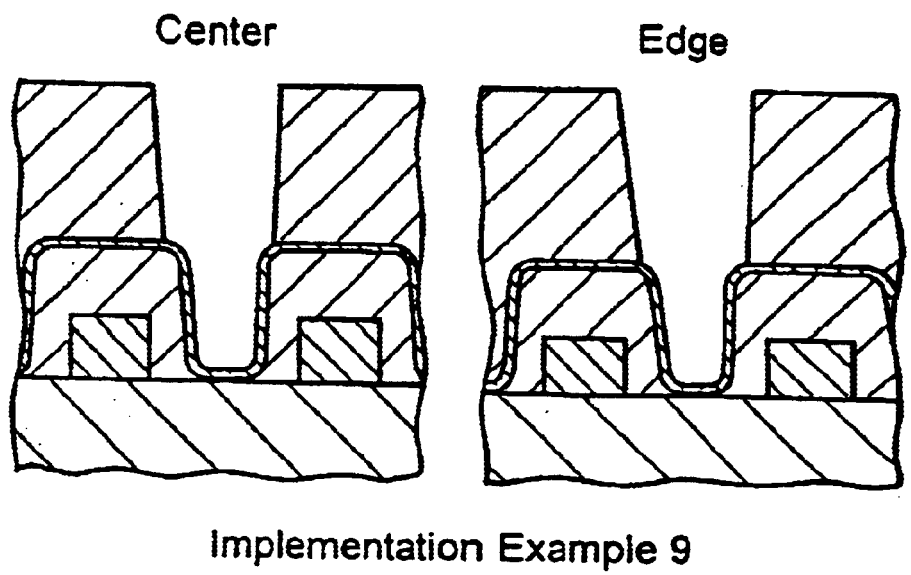
FIG. 12 is a schematic sectional view of a semiconductor wafer having undergone an etching process in an example of implementation of the present invention.

| Implementation example | High-frequency power (W) | Wafer surface uniformity (±%) | $SiO_2$ film layer average etching rate (lambda/min) | $SiO_2$/ $SiN_x$ selection ratio | Contact hole cross sectional shape |
|---|---|---|---|---|---|
| 8 | 1400 | 3.6 | 4150 | 37.7 | FIG. 11 |
| 3 | 1500 | 1.2 | 4050 | 34.4 | FIG. 5 |
| 9 | 1600 | 8.9 | 4500 | 28.9 | FIG. 12 |

As shown in FIGS. 11 and 12, with the level of the high-frequency power applied to the lower electrode 106 at either 1400 (W) or 1600 (W) carbon accumulated less readily at the bottoms of the contact holes 210 and the shoulders 207 of the $SiN_x$ film layer 206 did not become etched readily either. However, while the selection ratio of the $SiO_2$ film layer 208 relative to the $SiN_x$ film layer 206 improved when the high-frequency power was set at 1400 (W), some accumulation of carbon was observed at the bottom of the contact hole 210. No accumulation of carbon at the bottom of the contact hole 210 was observed when the high-frequency power was set at 1600 (W). It goes without saying that when high-frequency power at 1500 (W) was applied to the lower electrode 106 as in implementation example 3 described earlier, contact holes 210 achieving good a etching shape were formed, as illustrated in FIG. 5.

The results described above indicate that when performing an etching process on the wafer W by employing the etching apparatus 100 described above, contact holes 210 are formed in a specific shape at the wafer W by setting the high-frequency power applied to the lower electrode 106 within the range of 1400 (W)~1600 (W). In addition, since good etching characteristics were achieved by applying high-frequency power at 1600 (W) to the lower electrode 106, it is assumed that contact holes 210 can be formed in a specific shape even when the upper limit of the level of power supplied to the lower electrode 106 is raised to 1700 (W).

It is to be noted that since the high-frequency power levels described above were set for the etching apparatus 100, contact holes 210 may not be formed as described above if implementation example 3, 8 or 9 is adopted in a different processing apparatus. Such variance of contact hole formation is attributed to the fact that the quantity of fluorine radicals entering toward the bottoms of the contact holes 210 and the quantity of carbon deposited onto the inner wall surface of the contact hole 210 are affected by the plasma density inside the processing chamber 104. Accordingly, the density of plasma inside the processing chamber 104 was measured by applying 1400 (W)~1700 (W) high-frequency power at 13.56 (MHz) to the lower electrode 106 as described earlier and the numerical values thus obtained were $1.5 \times 10^{10}$ (number of ions/cm$^3$)~$1.2 \times 10^{11}$ (number of ions/cm$^3$). Thus, by generating plasma inside the processing chamber 104 so as to achieve a plasma density within the range of $1.5 \times 10^{10}$ (number of ions/cm$^3$)~$1.2 \times 10^{11}$ (number of ions/cm$^3$), contact holes 210 achieving a specific shape can be formed at the wafer W.

(D) Changes in the Temperature of Lower the Electrode Mounting Surface

Next, implementation examples in which the temperature of the mounting surface of the lower electrode 106 was varied are explained. In implementation examples 10 and 11 in the table below, the individual conditions other than the temperature of the mounting surface of the lower electrode 106 were set the same as those in implementation example 3. In addition, as in implementation examples 1~9 explained earlier, the surface uniformity at the wafer W and the selection ratio of the $SiO_2$ film layer 208 relative to the $SiN_x$ film layer 206 were ascertained with the resulting cross sectional shape of the wafer W illustrated for implementation examples 10 and 11. It is to be noted that the temperature of the inner wall surfaces of the processing chamber 104 was set at 60° C. as in implementation example 3.

TABLE 4

Figure 13:
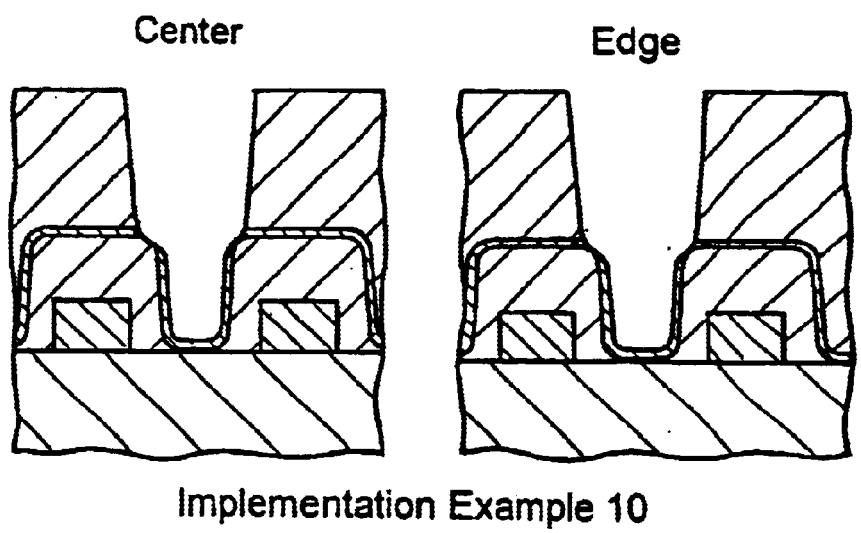
FIG. 13 is a schematic sectional view of a semiconductor wafer having undergone an etching process in an example of implementation of the present invention.
Figure 14:
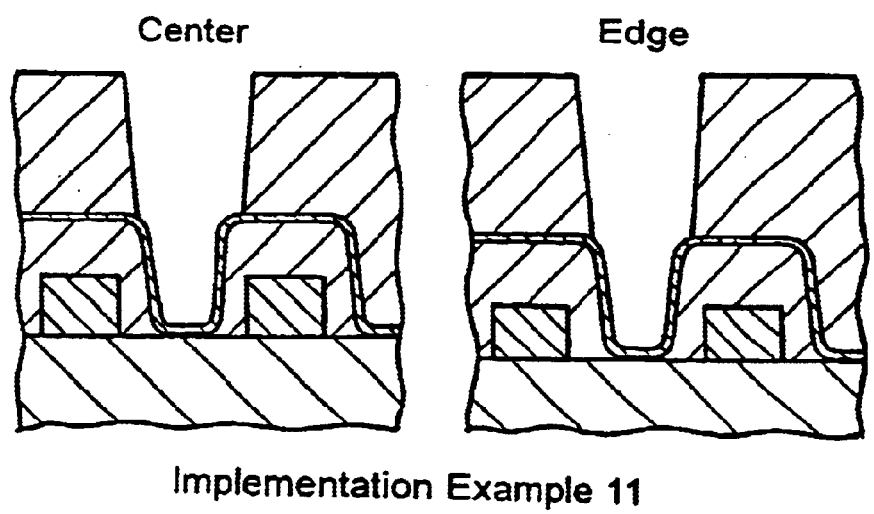
FIG. 14 is a schematic sectional view of a semiconductor wafer having undergone an etching process in an example of implementation of the present invention.

| Implementation example | Lower electrode mounting surface temperature (° C.) | Wafer surface uniformity (±%) | SiO$_2$ film layer average etching rate (lambda/min) | SiO$_2$/SiN$_x$ selection ratio | Contact hole cross sectional shape |
| --- | --- | --- | --- | --- | --- |
| 10 | 20 | 6.8 | 4400 | 20.6 | FIG. 13 |
| 3 | 40 | 1.2 | 4050 | 34.4 | FIG. 5 |
| 11 | 60 | 3.5 | 4250 | 58.2 | FIG. 14 |

With the temperature of the mounting surface of the lower electrode 106 set at 20° C., contact holes 210 achieving a specific depth were formed with the accumulation of carbon at the bottoms of the contact holes 210 occurring less readily as shown in FIG. 13, but, at the same time, the selection ratio of the SiO$_2$ film layer 208 relative to the SiN$_x$ film layer 206 was 20.6 and the shoulders 207 of the SiN$_x$ film layer 206 became etched, as illustrated in the same figure. In contrast, by setting the temperature of the mounting surface of the lower electrode 106 to 60° C., a selection ratio of 58.2 was achieved for the SiO$_2$ film layer 208 relative to the SiN$_x$ film layer 206 and the shoulder 207 of the SiN$_x$ film layer 206 were not etched as illustrated in FIG. 14. In addition, carbon did not accumulate at the bottoms of the contact holes 210 to enable formation of contact holes 210 achieving a specific depth at this temperature, as shown in the same figure. It goes without saying that when the temperature of the mounting surface of the lower electrode 106 was set at 40° C., as in implementation example 3, too, contact holes 210 achieving a specific depth and a specific shape were formed, as illustrated in FIG. 5. The results discussed above indicate that by setting the temperature of the mounting surface of the lower electrode 106 as high as possible above 20° C., contact holes 210 achieving a specific shape can be formed at the wafer W. However, if the temperature of the wafer W rises to a level equal to or higher than a specific temperature, the photoresist film layer 212 formed over the SiO$_2$ film layer 208 becomes melted and thus loses its function as an etching mask. For this reason, the upper limit of the temperature of the mounting surface of the lower electrode 106 should be the heat resistance temperature of the photoresist layer 212. Consequently, by setting the temperature of the mounting surface of the lower electrode 106 as appropriate within the range of 20° C.~the heat resistance temperature of the photoresist layer 212, contact holes 210 achieving a specific shape can be formed at the wafer W.

(E) Comparison of Implementation Example 3 and the Prior Art

Figure 15:
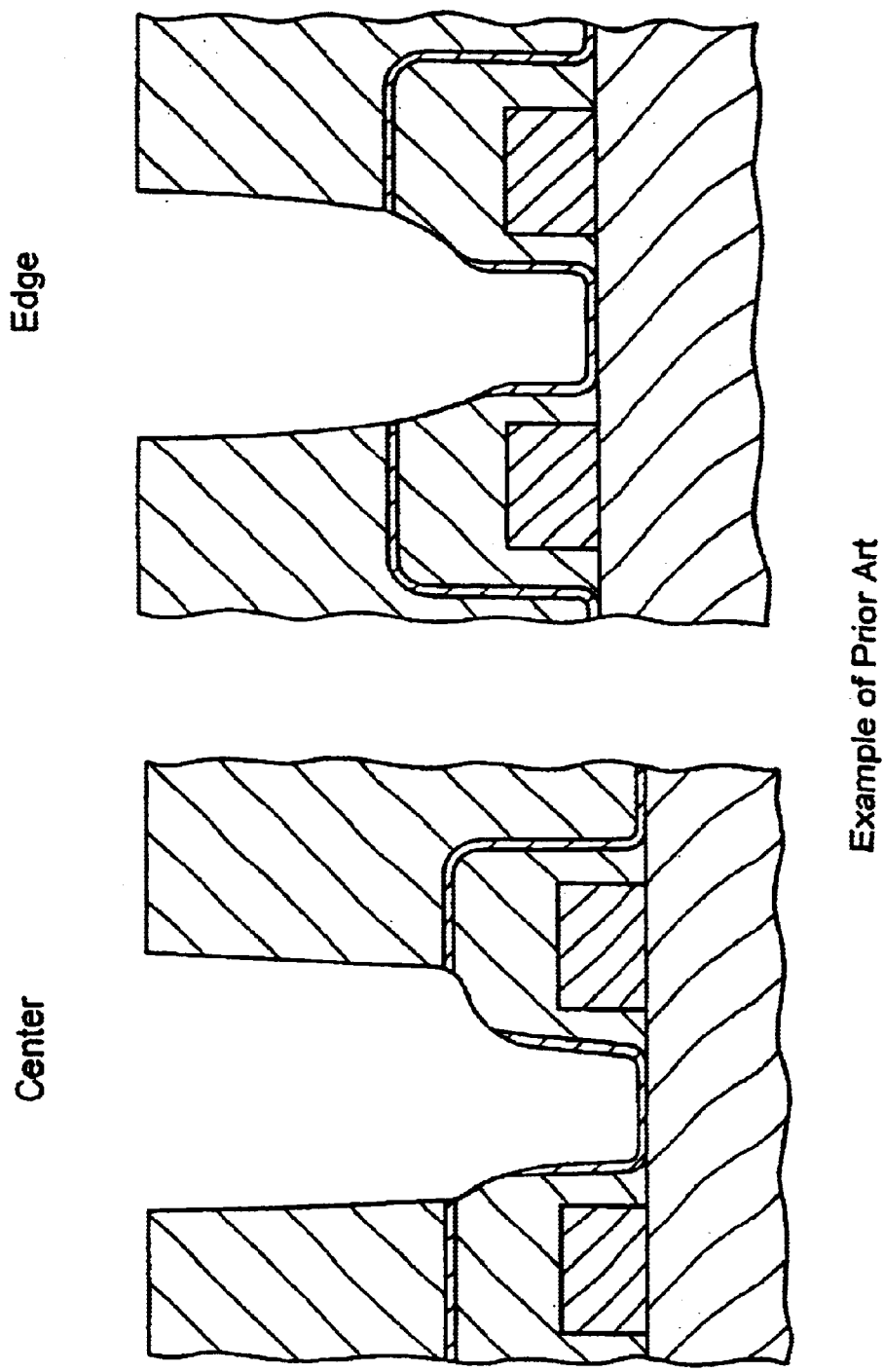
FIG. 15 is a schematic sectional view of a semiconductor wafer having been processed in an etching method in the prior art

Next, implementation example 3 illustrated in FIG. 5 in which contact holes 210 achieving a specific shape were formed with the highest degree of consistency at the wafer W among implementation examples 1~11 is compared with a prior art example illustrated in FIG. 15. First, the etching conditions adopted in implementation example 3 and the prior art example are explained. In both implementation example 3 and the prior art example, an etching process was implemented by using the etching apparatus 100, with the temperatures of the upper electrode 122 and the internal wall surfaces of the processing chamber 104 sustained at 60° C. and the temperature of the mounting surface of the lower electrode 110 sustained at 40° C. In addition, high-frequency power at 1500 W with a frequency of 13.56 (MHz) was applied to the lower electrode 106. Wafers W with a 200 mm diameter were used.

In addition, while the processing gas with its gas composition and flow rate ratio expressed as C$_4$F$_8$:CH$_2$F$_2$:Ar=7:4:500 (sccm) was induced into the processing chamber 104 in implementation example 3 as described earlier, a processing gas with its gas composition and flow rate ratio expressed as C$_4$F$_8$:CO:Ar=18:300:380 (sccm) was induced into the processing chamber 104 in the prior art example. In addition, while the pressure of the atmosphere inside the processing chamber 104 was set at 50 (mTorr) as described above in implementation example 3, the pressure of the atmosphere inside the processing chamber 104 was set at 40 (mTorr) in the prior art example.

Next, the etching rates of the SiO$_2$ film layer 208, the degrees of surface uniformity at the wafer W and the selection ratios of the SiO$_2$ film layer 208 relative to the SiN$_x$ film layer 206 achieved in implementation example 3 and the prior art example are explained.

First, the etching rates of the SiO$_2$ film layer 208 are explained. In implementation example 3, an etching rate of 4000 (Å/min) was achieved at the center of the wafer W and an etching rate of 4100 (Å/min) was achieved at the edge, as explained earlier. In the prior art example, on the other hand, an etching rate of 4600 (Å min) was achieved at the center and an etching rate of 5200 (Å min) was achieved at the edge. In addition, while the degree of surface uniformity at the wafer W achieved in implementation example 3 was ±1.2% as explained earlier, the corresponding degree achieved in the prior art example was ±6. 1%. Furthermore, while a selection ratio of 34.4 was achieved in implementation example 3 for the SiO$_2$ film layer 208 relative to the SiN$_x$ film layer 206, the corresponding ratio achieved in the prior art example was 11.2.

The results discussed above indicate that while the etching rate of the SiO$_2$ film layer 208 is lower than that achieved in the prior art example, improvements are achieved in the surface uniformity of the wafer W and the selection ratio of the SiO$_2$ film layer 208 relative to the SiN$_x$ film layer 206 when the wafer W is processed through the etching process adopted in implementation example 3, over those achieved in the prior art example. A particularly pronounced improvement was observed in implementation example 3 over the prior art example with regard to the selection ratio of the SiO$_2$ film layer 208 relative to the SiN$_x$ film layer 206, as shown in FIG. 15. Namely, the shoulders 207 of the SiN$_x$ film layer 206 exposed inside the contact hole 210 did not become etched at the wafer W shown in FIG. 5 having undergone the process adopted in implementation example 3 to enable formation of contact holes 210 achieving a specific shape. In contrast, at the wafer W shown in FIG. 15 having undergone the etching process in the prior art example, the SiO$_2$ film layer 204 covering the gates 202 became etched and ultimately damaged, as well as the shoulder 207 of the SiN$_x$ film layer 206. This leads to the conclusion that the contact holes 210 achieving a specific shape can be formed at the wafer W with a greater degree of ease by using the processing gas constituted of the mixed gas containing C$_4$F$_8$, CH$_2$F$_2$ and Ar in the implementation example rather than processing the wafer W with the processing gas constituted of the mixed gas containing C$_4$F$_8$, CO and Ar utilized in the prior art.

While the invention has been particularly shown and described with respect to a preferred embodiment and specific implementation examples thereof by referring to the attached drawings, the present invention is not limited to these examples and it will be understood by those skilled in the art that various changes in form and detail may be made therein without departing from the spirit, scope and teaching of the invention.

For instance, while an explanation is given above in reference to the embodiment on an example in which the mixed gas containing $C_4F_8$, $CH_2F_2$ and Ar alone is used as the processing gas to form contact holes, the present invention is not limited to such an example.

For instance, when forming contact holes 210 at the wafer W by employing the etching apparatus 100, for instance, the mixed gas with its gas composition and flow rate ratio expressed as $C_4F_8$:CO:Ar=18:300:380 (sccm) explained in reference to the prior art example may be first used as a processing gas to process the wafer W. At this time, the pressure of the atmosphere inside the processing chamber 104 shown in FIG. 1, should be set at approximately 55 (mTorr). Then, before or after the shoulder 207 of the $SiN_x$ film layer 206 become exposed inside the contact holes 210, a switch may be made to another mixed gas with its gas composition and flow rate ratio expressed as $C_4F_8$:$CH_2F_2$:Ar=7:4:500 (sccm) as in implementation example 3 to process the wafer W. The pressure of the atmosphere inside the processing chamber 104 during this process should be set at approximately 50 (mTorr).

By utilizing the mixed gas containing $C_4F_8$, CO and Ar as a processing gas in this manner, a carbon film can be deposited at the inner wall surface of the contact holes 210 with a high degree of reliability so that the contact holes 210 are formed in a specific shape while preventing the inner wall surfaces from becoming etched. In addition, by switching to another mixed gas containing $C_4F_8$, $CH_2F_2$, and Ar before or after the shoulder 207 of the $SiN_x$ film layer 206 become exposed, fluorine radicals can be allowed into the contact holes 210 to reach their bottoms in a reliable manner, to prevent a reduction in the penetration attributable to accumulation of carbon at the bottoms and prevent occurrence of an etching stop. Furthermore, since the shoulder 207 of the $SiN_x$ film layer 206 exposed inside the contact holes 210 are protected by the carbon film, the shoulder 207 do not become etched to enable quick formation of contact holes 210 achieving a higher aspect ratio and a specific shape. It is to be noted that a switch to the mixed gas containing $C_4F_8$, $CH_2F_2$ and Ar may be effected either before or after the shoulder 207 of the $SiN_x$ film layer 206 become exposed as explained earlier, or may be effected concurrently as the shoulder 207 of the $SiN_x$ film layer 206 become exposed. In addition, the switch to the other processing gas may be effected by, for instance, using a preset time point as reference, or may be effected in conformance to the end point detection value ascertained based upon the emission spectrum of the plasma inside the processing chamber 104.

It is to be noted that the process conditions other than the processing gas compositions, the flow rates of the processing gas constituents and the atmospheric pressure inside the processing chamber 104 adopted in the individual etching methods are set essentially the same as those adopted in the embodiment described earlier. In addition, while an explanation is given above in reference to the individual etching methods on an example in which Ar is added into the processing gas, the present invention is not restricted by such particulars, and any of various types of gases including an inert gas such as Kr and gases such as $O_2$, $N_2$, CO or $CO_2$ may be added in the processing gas. Furthermore, instead of Ar, any of various inert gases may be added, or the present invention may be implemented without adding any inert gas.

In addition, while an explanation is given in reference to the embodiment on an example in which the etching apparatus is provided with a magnet, the present invention is not limited to this structural example, and it may be adopted in a plasma-etching apparatus not having such a magnet. Moreover, while an explanation is given above on an etching apparatus in which high-frequency power is supplied to the lower electrode alone, the present invention is not restricted by such structural details, and it may be implemented by using a plasma-etching apparatus in which high-frequency power is applied to both the upper electrode and the lower electrode or a plasma-etching apparatus in which high-frequency power is applied to the upper electrode alone.

According to the present invention, in which a gas containing at least $C_4F_8$ and $CH_2F_2$ is utilized as the processing gas, etching ions can be allowed into contact holes toward their bottoms in a reliable manner while forming a carbon film at the inner wall surface of the contact holes and, more specifically, at the shoulder of the $SiN_x$ layer exposed inside the contact holes, to prevent accumulation of carbon at the bottoms. As a result, since the shoulder of the $SiN_x$ film layer that tend to become etched particularly readily can be protected, damage to the gates or to the insulating film layer covering the gates is prevented to achieve an improvement in yield. In addition, since the bottoms of the contact holes can be etched with a high degree of reliability without reducing the penetration or causing an etching stop, contact holes achieving a high aspect ratio are formed with ease.

INDUSTRIAL APPLICABILITY

The present invention may be adopted in an etching method employed in a semiconductor manufacturing process, and in particular, may be adopted in an etching method for plasma-etching an $SiO_2$ film layer covering an $SiN_x$ film layer formed at a workpiece placed inside an air-tight processing chamber by raising to plasma a processing gas induced into the processing chamber.

Key 100 etching apparatus
104 processing chamber
106 lower electrode
116 temperature control mechanism
120 high-frequency source
122 upper electrode
112a gas outlet hole
134, 140, 146 flow-regulating valve
136, 142, 148 gas supply source
200 Si substrate
202 gate
204 insulating film layer
206 $SiN_x$ film layer
207 shoulder
208 $SiO_2$ film layer
210 contact hole
W wafer

What is claimed is:

1. An etching method for plasma-etching an $SiO_2$ film layer covering an $SiN_x$ film layer formed at a workpiece placed inside an air-tight processing chamber by raising to plasma a processing gas induced into said processing chamber, comprising
   a first step in which said $SiO_2$ film layer is etched by using a mixed gas containing at least $C_4F_8$ and CO as said processing gas; and
   a second step in which a switch is made to a mixed gas containing at least $C_4F_8$ and $CH_2F_2$ to be used as said processing gas to etch said $SiO_2$ film layer immediately before said $SiN_x$ film layer becomes exposed.

2. An etching method for plasma-etching an $SiO_2$ film layer covering an $SiN_x$ film layer formed at a workpiece placed inside an air-tight processing chamber by raising to plasma a processing gas induced into said processing chamber, comprising a first step in which said $SiO_2$ film layer is etched by using a mixed gas containing at least $C_4F_8$ and CO as said processing gas: and a second step in which a switch is made to a mixed gas containing at least $C_4F_8$ and $CH_2F_2$ to be used as said processing gas to etch said $SiO_2$ film layer immediately after said $SiN_x$ film layer becomes exposed.

3. An etching method according to claim 1 or 2, wherein the flow rate ratio ($CH_2F_2/C_4F_8$) of $C_4F_8$ and $CH_2F_2$ in said mixed gas containing at least $C_4F_8$ and $CH_2F_2$ is set essentially within a range of 0.4~1.0.

4. An etching method according to claim 1 or 2, wherein the partial pressure corresponding to $C_4F_8$ relative to the entire pressure of said mixed gas containing at least $C_4F_8$ and $CH_2F_2$ is set essentially within a range of 0.4 (mTorr) ~0.8 (mTorr).

5. An etching method according to claim 1 or 2, wherein the density of plasma excited inside said processing chamber is set essentially within a range of $1.5 \times 10^{10}$ (number of ions/cm$^3$)~$1.2 \times 10^{11}$ (number of ions/cm$^3$).

6. An etching method according to claim 1 or 2, wherein:

said workpiece is placed on a mounting surface of a susceptor provided inside said processing chamber; and the temperature of said susceptor is set essentially within a range of 20° C.~the heat resistance temperature of a photoresist layer constituting a mask pattern for said $SiO_2$ film layer.

7. An etching method according to claim 1 or 2, wherein said mixed gas containing at least $C_4F_8$ and $CH_2F_2$ further contains an inert gas.

8. An etching method according to claim 1 or 2, wherein said mixed gas containing at least $C_4F_8$ and CO further contains an inert gas.

* * * * *

UNITED STATES PATENT AND TRADEMARK OFFICE
CERTIFICATE OF CORRECTION

PATENT NO. : 6,753,263 B1
DATED : June 22, 2004
INVENTOR(S) : Youbun Ito et al.

It is certified that error appears in the above-identified patent and that said Letters Patent is hereby corrected as shown below:

Column 17,
Line 6, "gas: and" should read -- gas; and --.

Column 18,
Line 3, "$1.5X10_{10}$" should read -- $1.5X10^{10}$ --.
Line 4, "$1.2X10_{11}$" should read -- $1.2X10^{11}$ --.

Signed and Sealed this

Sixteenth Day of November, 2004

JON W. DUDAS
*Director of the United States Patent and Trademark Office*